(12) United States Patent
Gronenborn (10) Patent No.: US 12,493,239 B2
(45) Date of Patent: Dec. 9, 2025

(54) METHOD OF LITHOGRAPHICALLY FORMING AN OPTICAL STRUCTURE IN A SEMICONDUCTOR SUBSTRATE

(71) Applicant: TRUMPF Photonic Components GmbH, Ulm (DE)

(72) Inventor: Stephan Gronenborn, Aachen (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 829 days.

(21) Appl. No.: 17/739,199

(22) Filed: May 9, 2022

(65) Prior Publication Data

US 2022/0269167 A1 Aug. 25, 2022

Related U.S. Application Data

(63) Continuation of application No. PCT/EP2020/084311, filed on Dec. 2, 2020.

(30) Foreign Application Priority Data

Dec. 10, 2019 (EP) ..................... 19214694

(51) Int. Cl.
G03F 7/00 (2006.01)
H01S 5/183 (2006.01)

(52) U.S. Cl.
CPC ........ *G03F 7/0005* (2013.01); *G03F 7/70283* (2013.01); *G03F 7/70558* (2013.01); *H01S 5/18388* (2013.01)

(58) Field of Classification Search
CPC ............... G03F 7/0005; G03F 7/70283; G03F 7/70558; H01S 5/18388; B29D 11/00365; G02B 3/0012; G02B 3/0075
(Continued)

(56) References Cited

U.S. PATENT DOCUMENTS

| 5,004,673 A | 4/1991 | Vlannes |
| 6,071,652 A | 6/2000 | Feldman et al. |

(Continued)

FOREIGN PATENT DOCUMENTS

| CN | 1266204 A | 9/2000 |
| CN | 101153919 A | 4/2008 |

(Continued)

*Primary Examiner* — Caleen O Sullivan
(74) *Attorney, Agent, or Firm* — LEYDIG VOIT & MAYER LTD.

(57) ABSTRACT

A method of forming an optical structure in a semiconductor substrate includes applying a layer of photoresist on a surface of the semiconductor substrate, exposing the photoresist with exposure light, and subsequently developing the photoresist. After developing, a remaining layer of the photoresist has a photoresist relief profile. The method further includes etching the photoresist and the semiconductor substrate to transfer the photoresist relief profile into the semiconductor substrate to obtain the optical structure in one or more first sub-areas and a support structure in one or more second sub-areas. A thickness of the layer of the photoresist applied to the surface of the semiconductor substrate is greater than a product of a maximum height difference of a relief profile of the optical structure and a ratio between etch rates of the photoresist and of the semiconductor substrate.

20 Claims, 5 Drawing Sheets

(58) Field of Classification Search
USPC .................................................. 430/311, 321
See application file for complete search history.

(56) References Cited

U.S. PATENT DOCUMENTS

| | | | |
|---|---|---|---|
| 6,979,521 B1 * | 12/2005 | Liu | ........................... G03F 1/50 |
| | | | 430/5 |
| 2004/0179564 A1 | 9/2004 | Maul et al. | |
| 2005/0230694 A1 | 10/2005 | See et al. | |
| 2006/0183027 A1 * | 8/2006 | Lin | ..................... H10F 39/8063 |
| | | | 430/5 |
| 2008/0080068 A1 | 4/2008 | Maeno | |
| 2010/0283981 A1 | 11/2010 | Van Bokhoven et al. | |
| 2011/0076058 A1 | 3/2011 | Ikuta et al. | |
| 2013/0223465 A1 | 8/2013 | Uchida et al. | |
| 2017/0299781 A1 | 10/2017 | Carson et al. | |
| 2017/0370554 A1 | 12/2017 | Mackinnon et al. | |

FOREIGN PATENT DOCUMENTS

| | | |
|---|---|---|
| CN | 101640376 A | 2/2010 |
| DE | 10260819 A1 | 7/2004 |
| DE | 202017003287 U1 | 9/2017 |
| EP | 3496216 A1 | 6/2019 |
| JP | 2002323747 A | 11/2002 |
| TW | 201802497 A | 1/2018 |

* cited by examiner

METHOD OF LITHOGRAPHICALLY FORMING AN OPTICAL STRUCTURE IN A SEMICONDUCTOR SUBSTRATE

CROSS REFERENCE TO RELATED APPLICATIONS

This application is a continuation of International Application No. PCT/EP2020/084311 (WO 2021/115883 A1), filed on Dec. 2, 2020, and claims benefit to European Patent Application No. EP 19214694,2, filed on Dec. 10, 2019. The aforementioned applications are hereby incorporated by reference herein.

FIELD

Embodiments of the present invention relate to a method of lithographically forming an optical structure in a semiconductor substrate.

BACKGROUND

Optical structures, in particular micro-optical structures with structure features in the range, may be used in laser arrangements comprising one or more lasers, especially one or more vertical cavity surface-emitting lasers (VCSELs). Such laser arrangements can be used for illumination devices, in particular for infrared illumination. VCSEL arrays emitting short light pulses may be applied in time-of-flight applications. Such applications comprise e.g. short-range gesture recognition for portable devices and 3D space recognition. The optical structure may be adapted to provide a desired field of illumination in a target scene.

A VCSEL or VCSEL array typically comprises a semiconductor substrate, also referred to as wafer, on which the layer structure of the VCSEL or VCSEL array is epitaxially grown. If the VCSEL or VCSEL array is configured as a bottom emitter, i.e. light emission occurs through the semiconductor substrate, the side of the substrate opposite to the VCSEL layer structure may be provided with an optical structure. Such an optical structure serves to shape the light emission of the VCSEL or VCSEL array into the desired field of illumination. For example, the optical structure may comprise one or more lenses with positive or negative refractive power, one or more diffracting elements, one or more diffusing or scattering elements, etc., depending on the desired beam shaping effect to be obtained.

It is desirable to integrate an optical structure directly into the semiconductor substrate of the VCSEL or VCSEL array instead of forming the optical structure by applying an additional material like a curable resin or connecting an optical structure produced as a separate part to the substrate. As typical semiconductor materials used for VCSELs wafers, e.g. GaAs, are at least partially transparent in the wavelength range of interest, in particular in the infrared wavelength range, it is advantageous to form the optical structure directly integrated in the semiconductor substrate.

An optical structure may have a surface topology or profile which may exhibit large height differences between peaks and valleys along the optical structure. The height differences may be as large as several μm or even more than 10 μm. These large height differences make it difficult to lithographically form the optical structure in the semiconductor substrate, because the large height differences of the surface profile of the optical structure to be formed may require a thick layer of photoresist to be applied to the initial semiconductor substrate. A thick photoresist layer may result in the formation of bubbles especially in the upper regions of the photoresist layer. In a subsequent etching process, after exposure of the photoresist, these bubbles may also be transferred into the semiconductor substrate resulting in a rough surface of the final optical structure, which in turn may lead to a deterioration of the desired optical function of the optical structure and to large scattering losses.

Further, when the optical structure is integrated in a VCSEL device, the device may be subject to post-processing steps like wafer-level testing, dicing, etc. In these post-processes, the optical structure may be damaged by scratches caused by mechanical contact with e.g. the hard surface of the wafer-level tester or a pick-and-place tool.

Thus, there is a need in an improved method of lithographically forming an optical structure in a semiconductor substrate.

U.S. Pat. No. 6,071,652 A discloses gray scale masks used to create optical elements. Direct contact or proximity printing is used to transfer the true gray scale pattern onto photoresist. The photoresist is then etched, thereby forming the desired pattern therein. The etched photoresist is then used to photolithographically fabricate either the optical element itself or a master element.

SUMMARY

In an embodiment, the present disclosure provides a method of lithographically forming an optical structure in a semiconductor substrate. The method includes providing the semiconductor substrate, applying a layer of photoresist on an initial surface of the semiconductor substrate, exposing the photoresist with exposure light, and subsequently developing the photoresist. A dose of the exposure light varies along an area of the semiconductor substrate such that, after developing, a remaining layer of the photoresist has a photoresist relief profile. The photoresist relief profile resembles the optical structure to be formed in the one or more first sub-areas, and in one or more second sub-areas outside the one or more first sub-areas, has a height over the initial surface of the semiconductor substrate that exceeds a maximum height of the remaining layer of the photoresist in the one or more first sub-areas. The method further includes etching the photoresist and the semiconductor substrate to transfer the photoresist relief profile into the semiconductor substrate to obtain the optical structure in the semiconductor substrate in the one or more first sub-areas, and a support structure in the one or more second sub-areas of the semiconductor substrate. The optical structure has a relief profile with a maximum height difference between a highest and a lowest point of the relief profile. A thickness of the layer of the photoresist applied to the initial surface of the semiconductor substrate is greater than a product of the maximum height difference and a ratio between etch rates of the photoresist and of the semiconductor substrate.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

It is an object of the present invention to provide a method of lithographically forming an optical structure in a semiconductor substrate such that the resulting optical structure exhibits a smooth surface and thus a desired optical performance.

It is a further object of the present invention to provide a method of lithographically forming an optical structure in a semiconductor substrate such that the optical structure is protected from possible damages.

According to an aspect of the invention, a method of lithographically forming an optical structure in a semiconductor substrate is provided, wherein the optical structure to be formed extends along one or more first sub-areas of the area of the substrate, the method comprising:

providing a semiconductor substrate;

applying a layer of photoresist on an initial surface of the semiconductor substrate;

exposing the photoresist with exposure light and subsequently developing the photoresist, wherein a dose of the exposure light varies along the area of the substrate such that, after developing, the remaining layer of photoresist has a photoresist relief profile, which, in the one or more first sub-areas resembles the optical structure to be formed, and, in one or more second sub-areas outside the one or more first sub-areas, has a height over the initial surface of the semiconductor substrate which exceeds the maximum height of the remaining layer of photoresist in the one or more first sub-areas;

etching the photoresist and the semiconductor substrate to transfer the photoresist relief profile into the semiconductor substrate to obtain the optical structure in the semiconductor substrate in the one or more first sub-areas and a support structure in the one or more second sub-areas of the semiconductor substrate.

In the method according to embodiments of the invention, the photoresist is exposed in the one or more sub-areas of the semiconductor substrate, where the optical structure is to be formed, with a different dose than in the one or more sub-areas where the optical structure is not to be formed. In case of a positive-tone photoresist, the dose of the exposure light is higher in the one or more sub-areas, where the optical structure is to be formed, than in the one or more sub-areas, where the optical structure is not to be formed. In case of a negative-tone photoresist, the dose of the exposure light is lower in the one or more sub-areas, where the optical structure is to be formed, than in the one or more sub-areas, where the optical structure is not to be formed. In the one or more second sub-areas where the optical structure is not to be formed, the dose of the exposure light may be chosen such that after development of the photoresist, the remaining thickness of the layer of photoresist is at least equal to, preferably larger than in the one or more first sub-areas. In the first sub-area(s), the upper region of the photoresist layer is completely developed and removed before the etch transfer, resulting in smooth optical surfaces.

Thus, in the method according to an embodiment of the invention, after developing (which also includes removing of the part of photoresist which is removable after developing), a pre-cursor of the optical structure to be formed has been generated in a lower part of the remaining layer of photoresist. This in turn renders it possible to make use of a thick layer of photoresist of several micrometers or even more than 10 micrometers so that optical structures with large height differences in the optical structure profile may be formed by the method according to embodiments of the invention. In thick photoresist layers, bubbles may be present in the photoresist. Such bubbles however have the tendency to collect in the upper region of the photoresist, while the lower region of the layer of photoresist remains mostly free of bubbles. Since the pre-cursor of the optical structure to be formed develops in the lower region of the layer of photoresist, the pre-cursor of the optical structure is fully or at least mostly free of bubbles, and has a smooth surface.

After etch transfer of the relief profile of the remaining photoresist into the semiconductor substrate, the optical structure is obtained in the semiconductor substrate accordingly with a smooth surface, and any bubbles which may be present after development of the photoresist in the upper region of the layer of photoresist, may also be transferred into the semiconductor substrate, however only in the sub-area or sub-areas outside the sub-area or sub-areas where the optical structure is formed.

After etch transfer of the relief profile of the remaining photoresist into the semiconductor substrate, the semiconductor substrate will exhibit substrate material excesses, for example in the shape of posts, ridges, etc., which exceed the highest level of the formed optical structure, and these substrate material excesses form a support structure in the sub-area or sub-areas outside the optical structure. The optical structure formed thus is buried in the semiconductor substrate and surrounded by a support structure exceeding the highest surface level of the optical structure. The support structure is suitable to protect the optical structure from mechanical damages. Since the support structure does not have any optical function, a surface roughness of the support structure is not disadvantageous.

Thus, the method according to embodiments of the invention enables forming optical structures with large height differences in the surface topology in semiconductor substrates with a smooth surface and good optical performance. At the same time the method according to embodiments of the invention enables the formation of a support structure for protecting the optical structure from mechanical damages.

In an embodiment, the optical structure to be formed may have a relief profile with a maximum height difference between a highest and a lowest point of the relief profile, wherein a thickness of the layer of photoresist applied to the surface of the semiconductor substrate is larger than a product of said maximum height difference and the ratio between etch rates of the photoresist and of the semiconductor substrate.

In this embodiment, the thickness of the layer of photoresist is set taking into account the different etch rates or etch sensitivities of the semiconductor substrate and the photoresist. The etch selectivity depends on the chosen etch process. For example, a ratio between the etch rate of the photoresist and the etch rate of the semiconductor substrate may be 1:1.25. If the maximum height difference in the relief profile of the optical structure to be formed is e.g. 12 μm, the thickness of the layer of photoresist applied to the surface of the semiconductor substrate is chosen to be at least 9.6 μm.

The thickness of the layer of photoresist applied to the surface of the semiconductor substrate may be larger than the afore-mentioned product by a factor in a range from 1.01 to 1.5. In the afore-mentioned example, the layer of photoresist applied on the initial surface of the substrate may have a thickness of 12 μm.

The maximum height difference of the relief profile of the optical structure to be formed may be larger than 5 μm for the method according to embodiments of the invention to work. In particular, the maximum height difference of the relief profile of the optical structure to be formed may be larger than 10 μm, and may be larger than 20 μm. The method according to embodiments of the invention allows for forming optical structures with such large height differences in the surface topology of the optical structure with good optical performance.

Further, the height of the photoresist relief profile in the one or more second sub-areas over the initial surface of the semiconductor substrate after development of the photoresist may exceed the maximum height of the layer of photoresist in the one or more first sub-areas by a factor in a range from 1.001 to 1.5. After transfer of the photoresist relief profile into the semiconductor substrate, a support structure thus is generated which sufficiently protects the optical structure from mechanical damage.

The photoresist used in the method according to embodiments of the invention may be a positive-tone photoresist or a negative-tone photoresist. In case of a positive-tone photoresist, the dose of the exposure light is lowest or zero in the one or more second sub-areas. If the photoresist is a negative-tone photoresist, the dose of the exposure light is highest in the one or more second sub-areas. In both cases, after development of the photoresist, the thickness of the remaining photoresist in the first sub-area or sub-areas is at least as large, preferably larger than in the second sub-area or sub-areas.

In case a positive-tone photoresist is used, the dose of the exposure light may vary along the one or more first sub-areas, where the optical structure is to be formed, in a range from 5% to 100%, or in a range from 10% to 100%, or in a range from 20% to 100%, or in a range from 30% to 100% of the maximum exposure dose.

In case of a negative-photoresist, the dose of the exposure light may vary along the one or more first sub-areas in a range from 0% to 95%, or in a range from 0% to 90%, or in a range from 0% to 80%, or in a range from 0% to 70% of the maximum exposure dose.

As described above, it is preferred, if the dose of exposure light in the first sub-area(s) is chosen such that the pre-cursor of the optical structure in the relief profile of the developed photoresist is generated in the lower region of the layer of photoresist, where the presence of bubbles is unlikely.

The exposing of the photoresist may be performed with a gray-scale mask.

The semiconductor substrate may comprise a III-V compound semiconductor.

A III-V compound semiconductor may be GaAs or any other compound semiconductor particularly suitable for a substrate of a VC SEL chip.

The optical structure to be formed according to embodiments of the invention may comprise one or more refractive structure elements, e.g. lenses or lens facets, or one or more diffractive structure elements, e.g. one or more gratings, or one or more diffusing or scattering structure elements.

The optical structure may comprise an array of lenses. Such an array of lenses is suitable in a VCSEL array comprising a plurality of VCSELs.

As indicated above, the semiconductor substrate may comprise one or more vertical cavity surface emitting lasers formed on a side of the substrate opposite to the side on which the optical structure is to be formed. In this manner, a VCSEL or VCSEL array may be formed configured as a bottom emitter, where laser light emission occurs through the semiconductor substrate.

Further features and advantages will become apparent from the following description and the accompanying drawings. Embodiments of the invention will be described with reference to the drawings.

Figure 1:
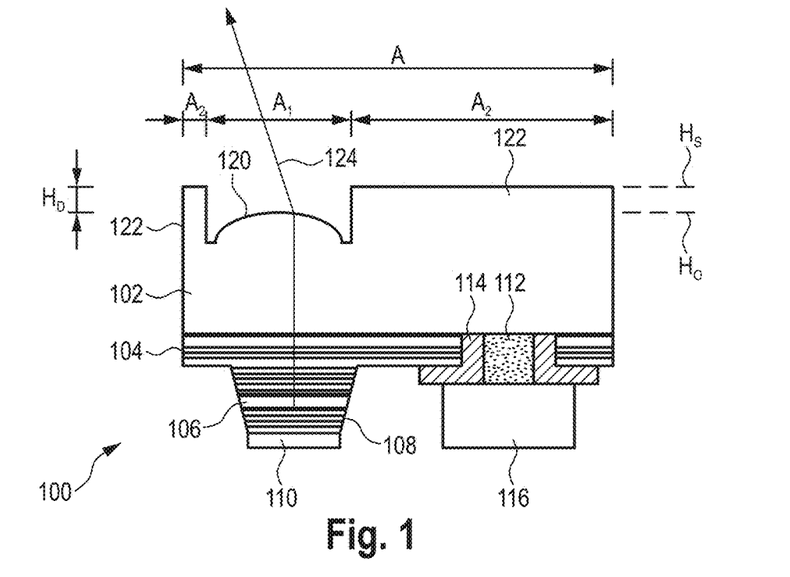
FIG. 1 shows a principle sketch of a cross-section of a VCSEL.

FIG. 1 shows a cross-section of a VCSEL 100. The VCSEL 100 comprises a substrate 102. The substrate 102 may comprise a semiconductor material, in particular a III-V compound semiconductor, in particular gallium arsenide (GaAs). On one side of the substrate 102, the VCSEL 100 may comprise an optical resonator comprising a first distributed Bragg reflector (DBR) 104, an active layer 106 and a second DBR 108. The first DBR 104, the active layer 106 and the second DBR 108 may comprise several layers forming the layer structure of the VCSEL 100. The first DBR 104 is arranged on the substrate 102, and the active layer 120 is sandwiched between the first DBR 104 and the second DBR 108. The first DBR 104 and the second DBR 108 may comprise a multitude of pair of layers with different refractive indices to provide reflectivity. The active layer 106 may comprise one or more quantum well layers. The optical resonator formed by the DBRs 104 and 108 and the active layer 106 are characterized by a mesa structure which is etched down to an intermediate layer of the first DBR 104. The second DBR 108 is covered by an electrical contact 110 to contact the VCSEL 100. Another contact 112 provides an electrical contact to the substrate 102. The electrical contact 112 is separated from the first DBR 104 by an electrical isolator 114. An electrical bond 116 is conductively connected to the electrical contact 112.

On a side of the substrate 102 opposite to the side where the resonator 104, 106, 108 is arranged, the substrate 102 comprises—integrated with the material of the substrate 102—an optical structure 120. A method of forming the optical structure 120 integrated with the substrate 102 will be described below.

The optical structure 120 extends along a first sub-area $A_1$ of the area A of the substrate 102. In the embodiment in FIG. 1, the first sub-area $A_1$ is a single sub-area surrounded by a second sub-area $A_2$ outside the first sub-area $A_1$. A support structure 122 is formed in the second sub-area $A_2$. As shown in FIG. 1, the support structure 122 has a height level $H_S$ which is a t least as high as, preferably exceeds the maximum height level $H_O$ of the optical structure 120. The optical structure 120 thus is "buried" in the substrate 102 and surrounded by the support structure 122. The support structure 122 avoids or at least reduces the risk that the optical structure 120 can be mechanically damaged, e.g. scratched.

The support structure 122 is formed in the same method together with the optical structure 120 as will be described below.

The VCSEL 100 is a so-called bottom emitter, i.e. laser light emission generated in the optical resonator 104, 106, 108 is transmitted through the substrate 102 and through the optical structure 102 integrated in the substrate 102, as illustrated by an arrow 124.

The optical structure 120 in the embodiment in FIG. 1 may comprise a single refractive structure element, e.g. a lens. The optical structure 120 may be configured as diffractive structure or as a diffusor in other embodiments.

Figure 2:
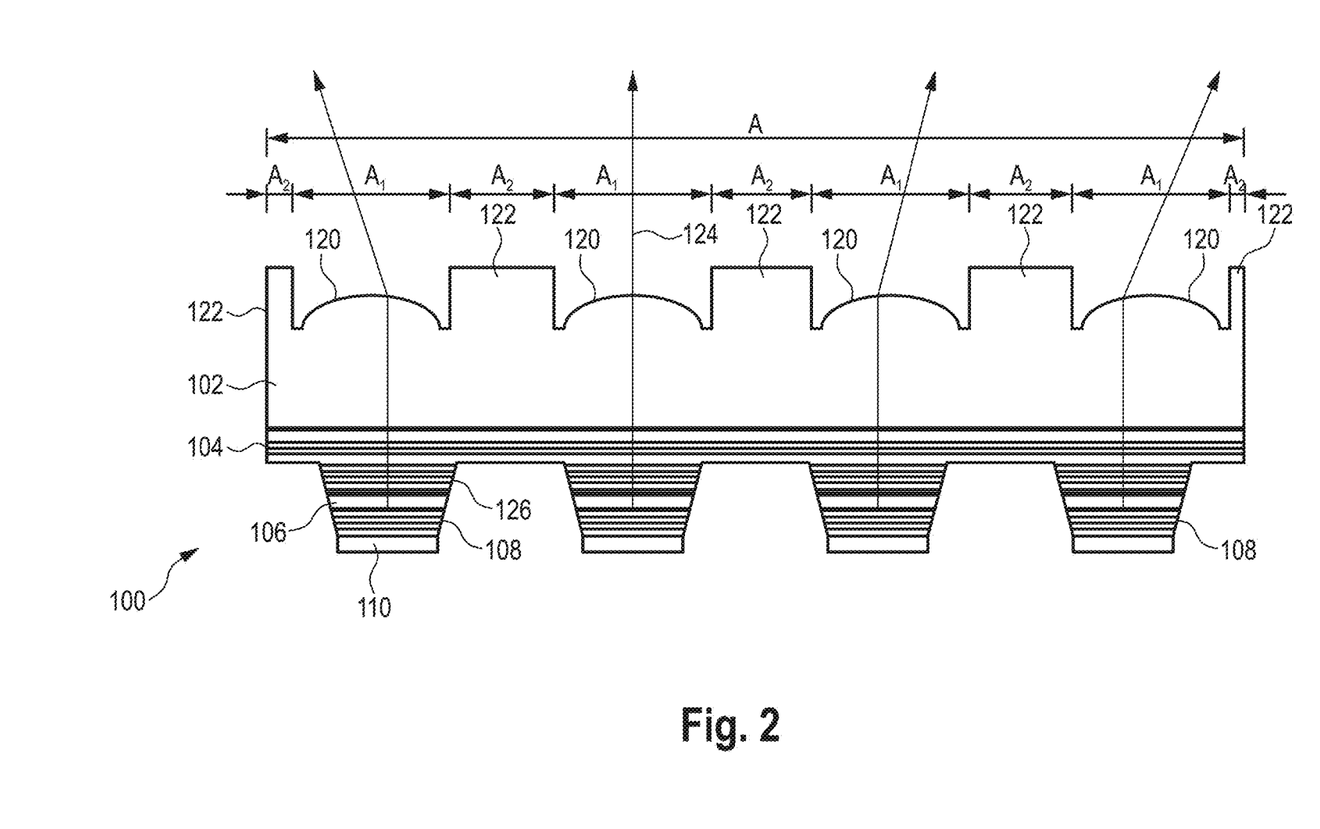
FIG. 2 shows a sketch of a cross-section of a VCSEL array.

FIG. 2 shows an embodiment of a VCSEL array 100. Elements of the VCSEL array 100 which are identical, similar or comparable with elements of the VCSEL 100 in FIG. 1 are denoted with the same reference numerals as in FIG. 1. The description of FIG. 1 also applies to FIG. 2 as far as not indicated otherwise in the following.

The VCSEL array 100 comprises a plurality of VCSELs or mesas 126 on a common substrate 102. Like in the embodiment in FIG. 1, the substrate 102 is made of a semiconductor material, in particular a III-V compound semiconductor material. The substrate 102 may comprise GaAs.

The substrate 102 comprises—integrated with the substrate 102—an optical structure 120 associated with the plurality of mesas 126. In FIG. 2, four mesas 126 are shown, and the optical structure 120 comprises four optical structure elements, e.g. lenses, associated with one of the mesas 126 in each case.

The optical structure 120 extends along a plurality of sub-arrays $A_1$, and is surrounded by a support structure 122 arranged in a plurality of sub-areas $A_2$. While FIG. 2 shows the support structure 122 in all of the sub-areas $A_2$ outside the sub-areas $A_1$, it is to be understood that the support structure 122 can be present in less than all sub-areas $A_2$.

In FIG. 2, only the electrical contacts 110 are shown, while the further electrical contacts 112, 116 are not shown in FIG. 2.

Figure 3:
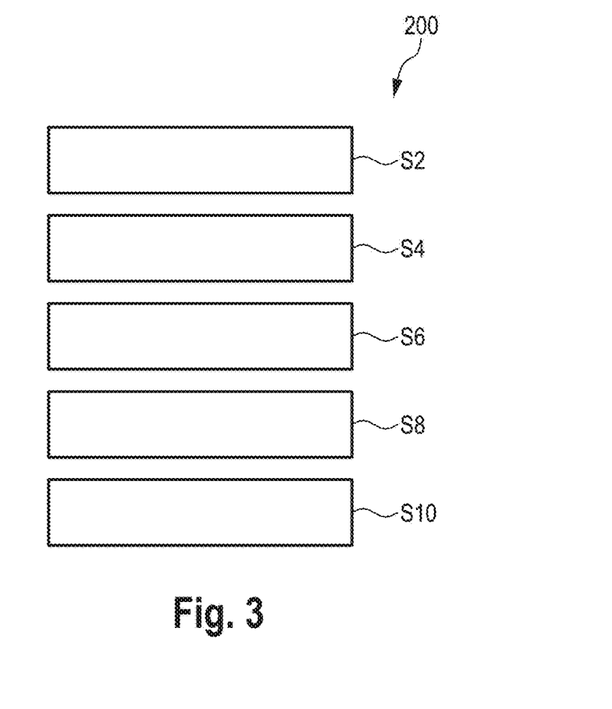
FIG. 3 shows a principle flow diagram of a method of forming an optical structure in a semiconductor substrate.

With reference to FIG. 3, a method 200 of lithographically forming an optical structure, such as optical structure 120 in FIGS. 1 and 2, in a semiconductor substrate, such as semiconductor substrate 102 in FIGS. 1 and 2. Further details will be described later with respect to FIGS. 4 to 8.

At S2, a semiconductor substrate is provided. The semiconductor substrate has an initial surface which preferably is plane. The semiconductor substrate may comprise GaAs. The initial surface of the semiconductor substrate is processed as described below in order to form the optical structure in the semiconductor substrate.

At S4, a layer of photoresist is applied to the initial surface of the semiconductor substrate. The photoresist may be a commercially available photoresist. The photoresist may be a positive-tone photoresist or a negative-tone photoresist. Examples of positive-tone photoresists are PMMA, S1800, SPR-220 or ma-P1200. Examples of negative-tone photoresists are SU-8, KMPR®, UVN-30, ma-N 1400, ma-N 2400. For the present method, preferentially a photoresist sensitive in the ultraviolet wavelength range is used.

The layer of photoresist is applied onto the initial surface of the semiconductor substrate with a layer thickness which depends on the optical structure to be formed. In particular, the thickness of the layer of photoresist may be related to the maximum height difference of the relief profile of the optical structure to be formed between a highest and a lowest point of the relief profile. In FIG. 1, the maximum height difference is denoted with $H_D$ which is the height difference between the apex of the lens forming the optical structure 120 and the edge of the lens in this simple example. If the optical structure has a more complex relief profile, as described below with reference to FIGS. 4 and 5, the thickness of the layer of photoresist is also preferentially related to the maximum height difference between a highest and a lowest point of the relief profile. The thickness of the layer of photoresist applied to the surface of the semiconductor substrate may be particularly larger than a product of the afore-mentioned maximum height difference and the ratio between etch rates or etch sensitivities of the photoresist used and of the semiconductor substrate in an etching process.

As an example, for a ratio of the etch rate of the photoresist to the etch rate of the semiconductor substrate of 1:1.25, and a maximum height difference between a highest and a lowest point of the relief profile of 12 µm, the thickness of the layer of photoresist may be chosen to be at least 9.6 µm, and may be chosen larger than said value, e.g. by a factor in a range from 1.01 to 1.5.

The maximum height difference between a highest and a lowest point of the relief profile of the optical structure to be formed may be in a range from 5 µm to 20 µm or even larger than 20 µm.

At S6, the photoresist is exposed with exposure light. The exposure light may be ultraviolet (UV) radiation provided by a suitable light source. A dose of the exposure light varies along the area (e.g. the area A in FIG. 2) of the substrate (e.g. substrate 102 in FIG. 2). The dose of the exposure light is meant to be the amount or intensity of exposure light reaching the surface of the layer of photoresist.

Exposing the photoresist may be performed by using a gray-scale mask which provides a variation of the dose of the exposure light along the area of the substrate. A gray-scale mask has an optical density which varies along the area of the mask. The optical density at a location along the area of the mask is a measure for the transmittance of light through the mask at this location.

The dose of the exposure light varies along the area of the substrate in dependence on the relief profile of the optical structure to be formed. In case of a positive-tone photoresist, a higher dose of the exposure light at a certain location along the area of the substrate results in a larger amount of photoresist removed after developing the photoresist at this location, and vice versa. In case of a negative-tone photoresist, this effect is reversed.

In case of a positive-tone photoresist, the dose of the exposure light may be lowest or zero in the sub-areas of the semiconductor substrate, where the support structure is to be formed and the optical structure is not to be formed. In case of a negative-tone photoresist, the dose of the exposure light is highest in the sub-area or sub-areas of the semiconductor substrate, where the support structure is to be formed and the optical structure is not to be formed.

In the sub-area or sub-areas where the optical structure is to be formed, the dose of the exposure light may vary in a range from 5% to 100%, or in a range from 10% to 100%, or in a range from 20% to 100%, or in a range from 30% to 100% of the maximum exposure dose in case of a positive-tone photoresist. The maximum exposure dose may be the dose required to expose the layer of photoresist down to or close to the lower surface of the layer of photoresist.

In case of a negative-tone photoresist, the dose of the exposure light may vary along the one or more sub-areas where the optical structures to be formed, in a range from 0% to 95%, or in a range from 0% to 90%, or in a range from 0% to 80%, or in a range from 0% to 70% of the maximum exposure dose.

At S8, the exposed photoresist is developed, using a developing agent as known in the art. Developing is understood to include removing of the part of photoresist which is removable, e.g. soluble, after exposure.

Developing the exposed photoresist results in a relief profile of the layer of photoresist which is the result of the variation of the dose of the exposure light along the area of the substrate in the exposing process. In the one or more first sub-areas where the optical structures to be formed, the relief profile resembles the optical structure to be formed. "Resembles" is understood such that the relief profile of the photoresist remaining after development is a pre-cursor of the relief profile of the optical structure to be formed. This may include that the relief profile of the developed photoresist is identical or only similar to the optical structure to be formed. "Similar" includes that the relief profile of the developed photoresist may have the same shape as the relief profile of the optical structure to be formed, but differs therefrom in terms of height differences between peaks and valleys of the optical structure.

The relief profile of the developed photoresist exhibits— in the one or more second sub-areas outside the sub-area or sub-areas where the optical structure is to be formed—a height level over the initial surface of the semiconductor substrate which is equal to or exceeds the maximum height of the layer of photoresist in the sub-area or sub-areas where the optical structure is to be formed. In other words, the remaining thickness of the layer of photoresist is highest in the sub-area or sub-areas of the area of the semiconductor substrate where the support structure is to be formed.

At S10, the remaining layer of photoresist developed beforehand and the semiconductor substrate are etched. Etching may be performed by any etching process known to a skilled person which is suitable to etch the photoresist and the semiconductor substrate. By the etching process, the relief profile of the developed remaining layer of photoresist is transferred into the semiconductor substrate to obtain the optical structure in the semiconductor substrate in the one or more sub-areas where the optical structure is to be formed, and the support structure in the remaining sub-area or sub-areas outside of the sub-area or sub-areas where the optical structure is to be formed. If the relief profile of the developed photoresist layer in the first sub-area(s) is not identical with the relief profile of the optical structure to be formed, different etching rates or etching selectivities of the photoresist and the semiconductor substrate transfer the photoresist relief profile into the semiconductor substrate such that the desired relief profile of the optical structure is obtained, also in terms of peak-to-valley height differences. For example, if the etching rate of the semiconductor substrate is higher than the etching rate in the photoresist, height differences in the relief profile of the developed photoresist will be scaled up when transferred into the semiconductor substrate.

Optionally, an anti-reflective coating may be deposited onto the final surface of the optical structure formed.

The support structure obtained by the method described above, exceeds the highest level of the relief profile of the optical structure so that the optical structure is buried in the semiconductor substrate and surrounded by higher material excesses, e.g. ridges, of the support structure.

With reference to FIGS. 4 to 8, an example of the method 200 described above, will be presented, which further elucidates the method 200 of lithographically forming an optical structure in a semiconductor substrate.

Figure 4:
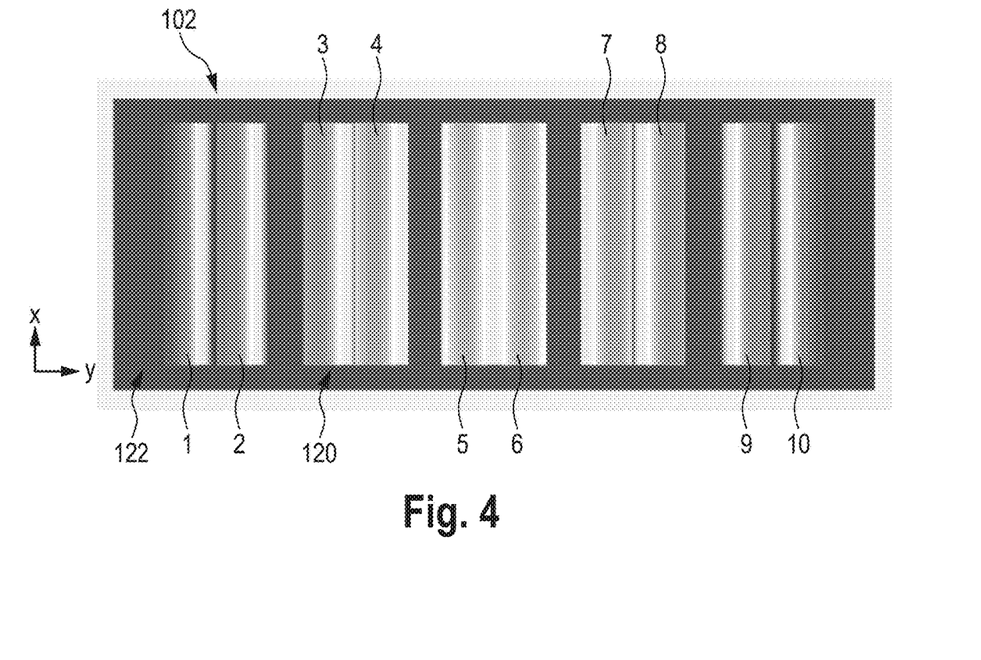
FIG. 4 shows a top plan view of an optical structure to be formed by the method according to embodiments of the invention.
Figure 5:
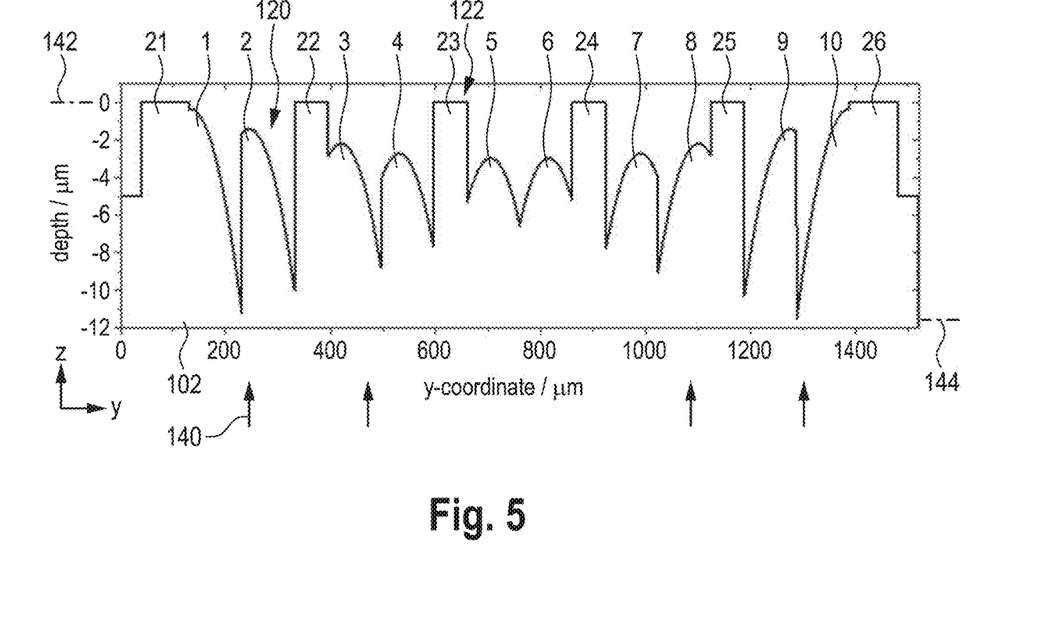
FIG. 5 shows a sketch of a side view of the optical structure in FIG. 4 integrated into a semiconductor substrate.

FIG. 4 shows a top plan view of a semiconductor substrate 102 having integrated therewith an optical structure 120 and a support structure 122. FIG. 5 shows a schematic side view of the semiconductor substrate 102 including the optical structure 120 and the support structure 122.

In the present example, the optical structure 120 comprises an array of optical structure elements which are labeled with reference numerals 1, 2, . . . , 10 in FIGS. 4 and 5. The optical structure elements 1 to 10 are configured as tilted cylinder lenses in this example. The shape of the optical structure elements 1 to 10 may differ among the elements 1 to 10 as shown.

FIGS. 4 and 5 show a Cartesian coordinate system with an x-, an y-, and z-axis. The optical structure elements 1 to 10 have an extension in direction of the x-axis, in direction of the y-axis and in direction of the z-axis. An array of VCSELs (not shown) may be associated with the substrate 102 as described above with reference to FIG. 2. The optical structure elements 1 to 10 may be associated with the VCSELs of the VCSEL array. The optical structure elements 1 to 10 may be associated with the VCSELs of the VCSEL array in a 1:1 relationship. Accordingly, the VCSEL array may comprise 10 VCSELs in this example.

Arrows 140 in FIG. 5 indicate the direction of light propagation through the substrate 102 including the optical structure 120 in operation of the VCSEL array.

FIG. 5 shows the relief profile of the optical structure 120 and of a support structure 122. In direction of the z-axis, the relief profile of the optical structure 120 has varying height differences between peaks and valleys, with an uppermost peak (at elements 1 and 10) slightly below a level 142 and a lowermost valley (at elements 1 and 10) at a level 144. The level 142 is the uppermost part of the surface of the substrate 102. As can be seen in FIG. 5, the optical structure elements 1 and 10 have the largest height difference of about 11.5 µm in this example.

The optical structure elements 1 to 10 of the optical structure 120 occupy first sub-areas of the total area of the semiconductor substrate 102. The support structure 122 occupies second sub-areas of the total area of the substrate 102 outside the first sub-areas. The support structure 122 comprises support structure elements which are labeled with reference numerals 21, 22, . . . , 26 in FIG. 5. The support structure elements 122 are configured as ridges which are placed between the optical structure elements 2 and 3, 4 and 5, 6 and 7, 8 and 9 and on the left side of optical structure element 1 and the right side of optical structure element 10. The support structure 122 may also be present at the edges of the substrate 102 in the x-direction.

As can be seen in FIG. 5, the support structure elements 21 to 26 have the highest height level along the substrate 102 which is the level 142, i.e. the top surface of the substrate 102. The optical structure 120 thus is buried in the substrate 102 and surrounded by the support structure 122.

Figure 6:
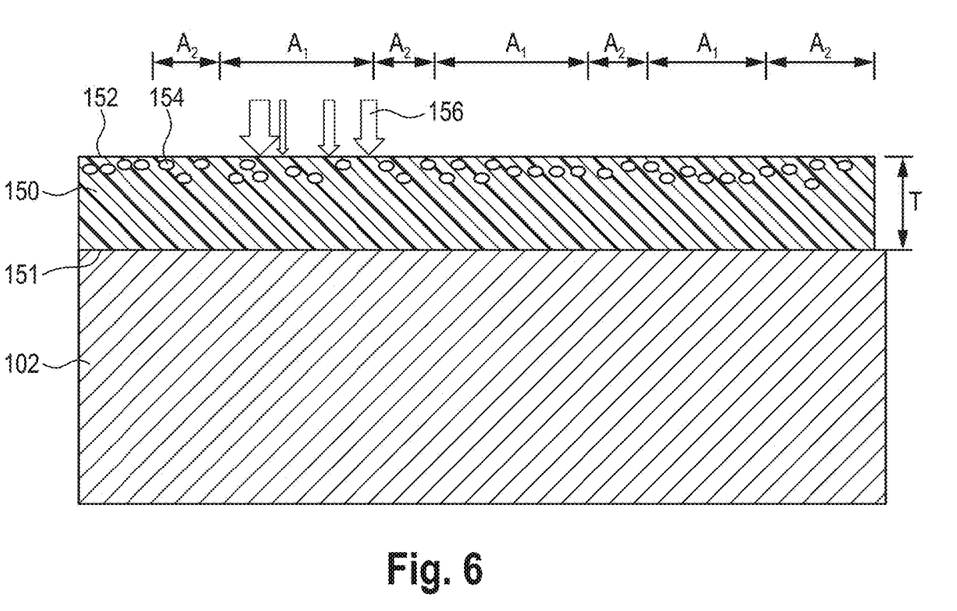
FIG. 6 shows a semiconductor substrate with a photoresist layer applied thereon according to a stadium of a method of forming an optical structure in the semiconductor substrate.
Figure 7:
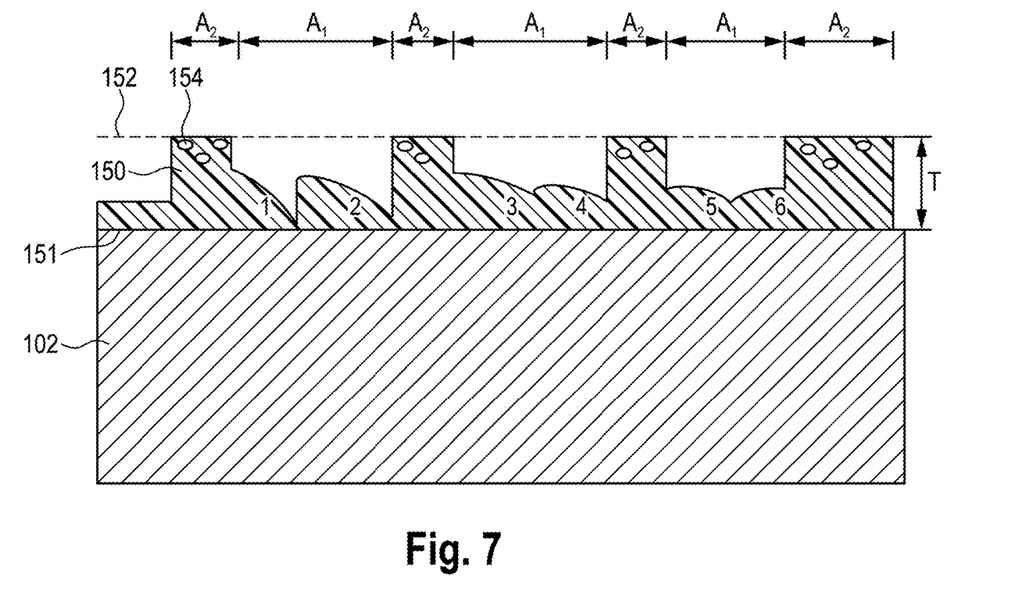
FIG. 7 shows the semiconductor substrate in FIG. 6 with the photoresist layer applied thereon after exposure and developing of the photoresist according to another stadium of the method of forming an optical structure in the semiconductor substrate.
Figure 8:
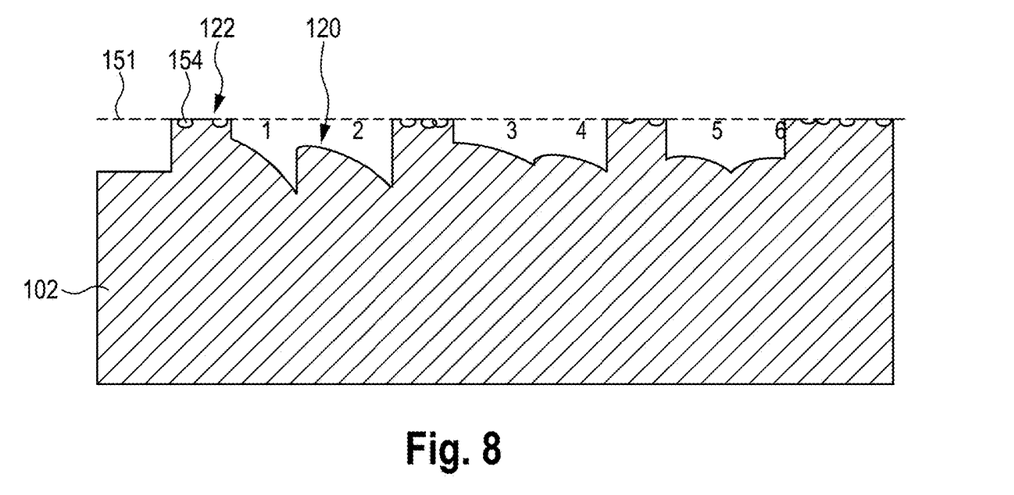
FIG. 8 shows the semiconductor substrate in FIGS. 6 and 7 after etch transfer of the relief profile of the developed photoresist layer into the semiconductor substrate.

In the following, with reference to FIGS. 6 to 8, a process for forming the optical structure 122 in the semiconductor substrate 102 which may be a GaAs substrate, will be described. Reference is also made to FIG. 3 with respect to steps S4 to S10. In FIGS. 7 and 8, only optical structure elements 1 to 6 are shown. FIGS. 6 to 8 are not in scale with FIGS. 4 and 5.

In FIG. 6 and as described above with respect to FIG. 3 at S4, a layer of photoresist 150 is applied onto an initial surface 151 of the substrate 102. In FIG. 6, a broken line 152 illustrates the top surface of the layer of photoresist 150.

In the present example of FIGS. 4 and 5, in which the height difference between a highest peak and a lowest valley of the relief profile of the optical structure 120 to be formed is about 11.5 µm, the thickness T of the layer of photoresist may be chosen as follows. A ratio of an etch rate or sensitivity of the photoresist 150 and an etch rate or sensitivity of the semiconductor substrate may be assumed to be 1:1.25. The product of the maximum height difference of the relief profile of the optical structure 120 and the afore-mentioned ratio of the etch rates provides a minimum thickness of the layer of photoresist 150 of about 9 µm. Preferentially, the thickness T is chosen larger than this product. The thickness T may be chosen, for example, 3 µm larger than the afore-mentioned product so that the thickness T of the layer of photoresist 150 may be chosen to be about 12 µm in this example.

Such a large thickness T of the layer of photoresist 150 may result in the formation of bubbles 154 in an upper region of the layer of photoresist 150, as illustrated in FIG. 6. FIG. 6 also shows the first sub-areas $A_1$ where the optical structure 120 is to be formed, and the second sub-areas $A_2$ where the optical structure is not to be formed, but instead the support structure 122. As can be seen, bubbles 154 may be present in the first sub-areas $A_1$ and in the second sub-areas $A_2$.

According to S6 in FIG. 3, the photoresist is exposed with exposure light 156 indicated in FIG. 6 by a few arrows. The exposure light may be UV light. It is to be understood that exposure light is applied along the entire surface 152 of the layer of photoresist 150. Different widths of the arrows 156 in FIG. 6 illustrate different doses of exposure light, indicating the variation of the dose of the exposure light along the surface 152 of the layer of photoresist 150. The wider an arrow, the higher the dose of exposure light. The exposure of the photoresist 150 may be performed through a gray-scale mask as described above.

For the following description, it is assumed that the photoresist 150 is a positive-tone photoresist. It will be apparent to a skilled person from the following description, how the method has to be modified, if a negative-tone photoresist is used.

In the first sub-areas $A_1$ in which the optical structure 120 is to be formed, the dose of the exposure light may vary between 5% and 100% of the maximum exposure dose. Here, the maximum exposure dose (100%) is an exposure dose which leads, after developing the photoresist 150, to the complete removal of the photoresist down to the surface 151 of the substrate 102. In the second sub-areas $A_2$, the dose of the exposure light is lowest, for example zero.

Next, when the photoresist 150 is developed (S8 in FIG. 3), the remaining layer of photoresist 150 exhibits a relief profile as shown in FIG. 7. In the first sub-areas $A_1$, the relief profile of the remaining photoresist 150 resembles the relief profile of the optical structure 120 to be formed in the semiconductor substrate 102, thus is a pre-cursor of the relief profile of the optical structure 120 to be formed. The height differences between peaks and valleys in the photoresist relief profile however may differ from the corresponding height differences between peaks and valleys in the optical structure relief profile to be formed, in particular lower. In the second sub-areas $A_2$, in which the photoresist 150 is exposed with a lower dose than the lowest exposure dose in the sub-areas $A_1$, e.g. with a dose lower of 5% or even 0%, the relief profile of the remaining photoresist 150 after developing exhibits the largest remaining thickness of the layer of photoresist, which may be as large as the original thickness T before exposing the photoresist.

In the first sub-areas $A_1$, the remaining resist thickness is lower, in particular significantly lower than in the second sub-areas $A_2$, e.g. is in a range between 0 µm and 9 µm in the above example, while the remaining thickness of the photoresist layer in the second subareas $A_2$ is equal to or larger than 9 µm in this example. The thickness of the remaining photoresist 150 in the second sub-areas $A_2$ may exceed the thickness in the first sub-areas $A_1$ by a factor in a range from 1.001 to 1.5.

As can be seen by a comparison of FIG. 7 with FIG. 6, after exposing and developing the photoresist 150, bubbles in the first sub-areas $A_1$ are removed with removal of the upper region of the photoresist 150 in these sub-areas. Thus in the sub-areas $A_1$, the remaining photoresist layer 150 has a smooth surface. In other words, since the precursor of the optical structure is generated in the lower region of the photoresist layer 150, the risk of bubbles in the precursor is at least mostly eliminated.

According to S10 in FIG. 3, the relief profile of the remaining photoresist of the layer of photoresist 150 is then etch-transferred into the semiconductor substrate 102 resulting in the buried optical structure elements 1, 2, . . . , 6 and support structure 122 as shown in FIG. 8.

After etch transfer of the relief profile of the remaining layer of photoresist 150 in FIG. 7, the optical structure elements 1 to 6 are generated as being integrated in the substrate 102 as shown in FIG. 8. The etch transfer leads to the predetermined full height differences in the relief profile of the optical structure 120, due to the etch selectivity between the photoresist and the semiconductor of the substrate 102. A broken line in FIG. 7 denotes the initial surface 151 of the semiconductor substrate 102.

The optical structure elements 1 to 6 shown in FIG. 8 have a smooth surface and are free of bubbles. Only in the sub-areas $A_2$ where the support structure 122 is formed, bubbles 154 may have been transferred from the photoresist 150 into the semiconductor substrate 102. Thus, if bubbles 154 are present in the upper region of the layer of photoresist 150 as shown in FIG. 6, they will only affect the surface roughness in the support structure 122 without affecting the optical quality of the optical structure 120.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method of lithographically forming an optical structure in a semiconductor substrate, the method comprising:
    providing the semiconductor substrate;
    applying a layer of photoresist on an initial surface of the semiconductor substrate;
    exposing the photoresist with exposure light and subsequently developing the photoresist, wherein a dose of the exposure light varies along an area of the semiconductor substrate such that, after developing, a remaining layer of the photoresist has a photoresist relief profile, which resembles a relief profile of the optical structure to be formed in the one or more first sub-areas, and in one or more second sub-areas outside the one or more first sub-areas, has a height over the initial surface of the semiconductor substrate that exceeds a maximum height of the remaining layer of the photoresist in the one or more first sub-areas; and
    etching the photoresist and the semiconductor substrate to transfer the photoresist relief profile into the semiconductor substrate to obtain: (i) the optical structure in the semiconductor substrate in the one or more first sub-areas, and (ii) a support structure in the one or more second sub-areas of the semiconductor substrate,
    wherein the relief profile of the optical structure has a first highest point $H_o$, the support structure has a second highest point $H_s$ that is higher than the first highest point $H_o$ by a height difference $H_D$, and wherein a thickness of the layer of the photoresist applied to the initial surface of the semiconductor substrate is greater than a product of the height difference $H_D$ and a ratio between an etch rate of the photoresist and an etch rate of the semiconductor substrate.

2. The method of claim 1, wherein the thickness of the layer of the photoresist applied to the initial surface of the semiconductor substrate is greater than the product by a factor in a range from 1.01 to 1.5.

3. The method of claim 1, wherein the height difference is greater than 5 μm.

4. The method of claim 3, wherein the height difference is greater than 10 μm.

5. The method of claim 4, wherein the height difference is greater than 20 μm.

6. The method of claim 1, wherein the height of the photoresist relief profile in the one or more second sub-areas over the initial surface of the semiconductor substrate after development of the photoresist exceeds the maximum height of the layer of photoresist in the one or more first sub-areas by a factor in a range from 1.001 to 1.5.

7. The method of claim 1, wherein the photoresist is a positive-tone photoresist, and the dose of the exposure light is lowest or zero in the one or more second sub-areas.

8. The method of claim 1, wherein the photoresist is a negative-tone photoresist, and the dose of the exposure light is highest in the one or more second sub-areas.

9. The method of claim 1, wherein the dose of the exposure light varies along the one or more first sub-areas in a range from 5% to 100% of a maximum exposure dose.

10. The method of claim 9, wherein the dose of the exposure light varies along the one or more first sub-areas in a range from 10% to 100% of the maximum exposure dose.

11. The method of claim 10, wherein the dose of the exposure light varies along the one or more first sub-areas in a range from 20% to 100% of the maximum exposure dose.

12. The method of claim 11, wherein the dose of the exposure light varies along the one or more first sub-areas in a range from 30% to 100% of the maximum exposure dose.

13. The method of claim 1, wherein the dose of the exposure light varies along the one or more first sub-areas in a range from 0% to 95% of a maximum exposure dose.

14. The method of claim 13, wherein the dose of the exposure light varies along the one or more first sub-areas in a range from 0% to 90%, or from 0% to 80%, or from 0% to 70% of the maximum exposure dose.

15. The method of claim 1, wherein the exposing of the photoresist is performed with a grey-scale mask, the gray-scale mask having an optical density that varies along an area of the semiconductor substrate in dependence on the relief profile of the optical structure to be formed, wherein the optical density at a respective location along the area of the semiconductor substrate is a measure of transmittance of light at the respective location.

16. The method of claim 1, wherein the semiconductor substrate comprises a III-V compound semiconductor.

17. The method of claim 16, wherein the semiconductor substrate comprises GaAs.

18. The method of claim 1, wherein the optical structure comprises one or more refractive elements, or one or more diffractive elements, or one or more diffusing elements.

19. The method of claim 1, wherein the optical structure comprises an array of lenses.

20. The method of claim 1, wherein the semiconductor substrate comprises one or more vertical cavity surface emitting lasers (VCSELs) formed on a side of the semiconductor substrate opposite to the initial surface of the semiconductor substrate on which the optical structure is to be formed.

* * * * *